United States Patent
Song et al.

(10) Patent No.: US 9,087,480 B2
(45) Date of Patent: Jul. 21, 2015

(54) SCAN LINES DRIVER AND ORGANIC LIGHT EMMITING DISPLAY DEVICE USING THE SAME

(71) Applicant: Samsung Display Co., Ltd., Yongin, Gyeonggi-Do (KR)

(72) Inventors: Hwa-Young Song, Yongin (KR); Seung-Kyu Lee, Yongin (KR); Ki-Myeong Eom, Yongin (KR)

(73) Assignee: Samsung Display Co., Ltd. (KR)

( * ) Notice: Subject to any disclaimer, the term of this patent is extended or adjusted under 35 U.S.C. 154(b) by 10 days.

(21) Appl. No.: 14/147,123

(22) Filed: Jan. 3, 2014

(65) Prior Publication Data
US 2015/0029169 A1    Jan. 29, 2015

(30) Foreign Application Priority Data
Jul. 24, 2013    (KR) ........................ 10-2013-0087505

(51) Int. Cl.
G09G 3/36    (2006.01)
G09G 3/32    (2006.01)

(52) U.S. Cl.
CPC .................................. *G09G 3/3225* (2013.01)

(58) Field of Classification Search
CPC .................................................... G09G 3/3225
See application file for complete search history.

(56) References Cited

U.S. PATENT DOCUMENTS

| | | | |
|---|---|---|---|
| 7,978,188 B2 * | 7/2011 | Shin | 345/204 |
| 8,054,281 B2 * | 11/2011 | Choi | 345/100 |
| 8,232,954 B2 * | 7/2012 | Han | 345/100 |
| 8,269,714 B2 * | 9/2012 | Furuta et al. | 345/100 |
| 2012/0075363 A1 * | 3/2012 | Kim | 345/691 |

FOREIGN PATENT DOCUMENTS

| | | |
|---|---|---|
| KR | 100748360 B1 | 8/2007 |
| KR | 1020100083321 A | 7/2010 |

* cited by examiner

*Primary Examiner* — Andrew Sasinowski
(74) *Attorney, Agent, or Firm* — Innovation Counsel LLP

(57) ABSTRACT

In a scan lines driver that is used for driving scan lines of an organic light emitting diodes (OLED) display, a large voltage drop can develop between the gate or source of one of its transistors and the corresponding drain during a scan signal outputting period. This large voltage drop can excessively stress the one transistor. However, in accordance with the present disclosure, a voltage drop dissipating, second transistor is provided in series with the first transistor for absorbing part of the large voltage drop and thus reducing the stress that is applied to the first transistor.

14 Claims, 7 Drawing Sheets

SCAN LINES DRIVER AND ORGANIC LIGHT EMMITING DISPLAY DEVICE USING THE SAME

RELATED APPLICATIONS

This application claims priority to and the benefit of Korean Patent Application No. 10-2013-0087505 filed in the Korean Intellectual Property Office on Jul. 24, 2013, the entire contents of which application are incorporated herein by reference.

BACKGROUND

1. Field

The described technology relates generally to a scan driving apparatus and an organic light emitting diode (OLED) display using the same.

2. Description of Related Technology

Display devices are used for personal computers, portable phones, portable information terminals such as PDAs, and the like, or monitors of various information providing devices. Among such display devices, known types include an LCD using a liquid crystal panel, an organic light emitting diode display using an organic light emitting element, a PDP using a plasma panel. Compared to a conventional cathode ray tube (CRT), the aforementioned display devices have comparatively reduced weight smaller size, and in particular, for the organic light emitting diodes (OLED) display they having excellent luminance and wide viewing angle and quick response speed.

OLED display devices may be classified into a passive matrix type of OLED display and an active matrix type of OLED display. From the viewpoint of resolution, contrast, and operation speed, the active matrix organic light emitting diode display which emits light selected for each unit pixel has become mainstream.

A typical OLED display device includes a display panel formed of a plurality of pixels arranged in a matrix format. The display panel includes a plurality of spaced apart scan lines formed to extend in a row direction, a plurality of spaced apart data lines formed to extend in a column direction, where the plurality of scan lines and the plurality of data lines respectively cross each other. Each of the plurality of pixels is driven by a respective scan signal and a respective data signal respectively transmitted from a corresponding scan line and a corresponding data line. Here, a scan driver generating scan signals for plural rows of pixels includes a plurality of stages, and each stage generates a respective single scan signal.

SUMMARY

Provided here is a scan lines driver of an OLED display device where the scan lines driver is configured to prevent or reduce damage and a characteristic change to one of its transistors due to a large stressing voltage developed during operation of the scan lines driver, where the characteristic change can lead to the undesired occurrence of a leakage current. More specifically, in the scan lines driver that is used for driving scan lines of an organic light emitting diodes (OLED) display, where a large voltage drop can develop between the gate or source of one of its transistors and the corresponding drain during a scan signal outputting period, where such a large voltage drop can excessively stress the one transistor; this overly stressful state is avoided by including a voltage drop dissipating, second transistor that is provided in series with the first transistor and is configured for absorbing part of the large voltage drop and thus reducing the stress that is applied to the first transistor.

A scan lines driver according to an exemplary embodiment includes a plurality of scan driving blocks, each including a first input terminal to which a frame start signal or an output signal of a previous block is input, second and third input terminals to which first and second clock signals are transmitted, and an output terminal to which a scan signal is output, and each of the plurality of scan driving blocks includes: a first transistor transmitting the frame start signal or the output signal of the previous block to an internal first node of the current block and according to the first clock signal; a second transistor outputting the second clock signal to the scan signal according to a voltage level of the first node; and a third transistor that is configured for dissipating part of a voltage drop between the third node and the first input terminal and thus limiting a bias voltage that is developed across the first transistor where the dissipation is a function of an on-resistance value of the third transistor.

Here, the third transistor is connected between the first transistor and the first node and maintains a turn-on state. Each of the plurality of scan driving blocks further includes: a fourth transistor including a gate electrode to which the first clock signal is transmitted, a first electrode connected to a second node, and a second electrode to which a first power source voltage is transmitted; a fifth transistor including a gate electrode connected to the first node, a first electrode connected to the second node, and a second electrode connected to the gate electrode of the fourth transistor; a sixth transistor including a gate electrode connected to the second node, a first electrode to which a second power source voltage is transmitted, and a second electrode connected to the output terminal; a seventh transistor including a gate electrode connected to the second node and a first electrode to which the second power source voltage is transmitted; and an eighth transistor including a gate electrode to which the second clock signal is transmitted, a first electrode connected to a second electrode of the seventh transistor, and a second electrode connected to the first node.

In one embodiment, the first to eighth transistors are PMOS transistors. Each of the plurality of scan driving blocks further includes a first capacitor including a first terminal to which the second power source voltage is transmitted and a second terminal connected to the second node, and a second capacitor including a first terminal connected to the first node and a second terminal connected to the output terminal. The first clock signal and the second clock signal have opposite phases and are overlapped with a same level during at least one period of time.

In each of the plurality of scan driving blocks, the second transistor is turned on by being synchronized by the first clock signal, and a voltage level of the second clock signal is output as the scan signal for a period during which the frame start signal or the output signal of the previous terminal is transitioning to a low-level voltage from a high-level.

An OLED display according to an exemplary embodiment includes: a display area unit including a plurality of data lines, a plurality of scan lines, and a plurality of pixels each connected to a corresponding data line and a corresponding scan line; and a scan lines driver as described above.

The described technology relates generally to a scan lines driver and an OLED display device using the same, and according to exemplary embodiments of the present disclosure of invention, a higher bias voltage than a power source voltage can be prevented from being applied to a transistor that transmits a frame start signal or an output signal of a previous terminal by using an on-resistance value of the third transistor and maintaining the turn-on state of the third transistor to thereby prevent an undesirable characteristic change of the first transistor and the occurrence of a leakage current due to the change.

DETAILED DESCRIPTION

Figure 1:
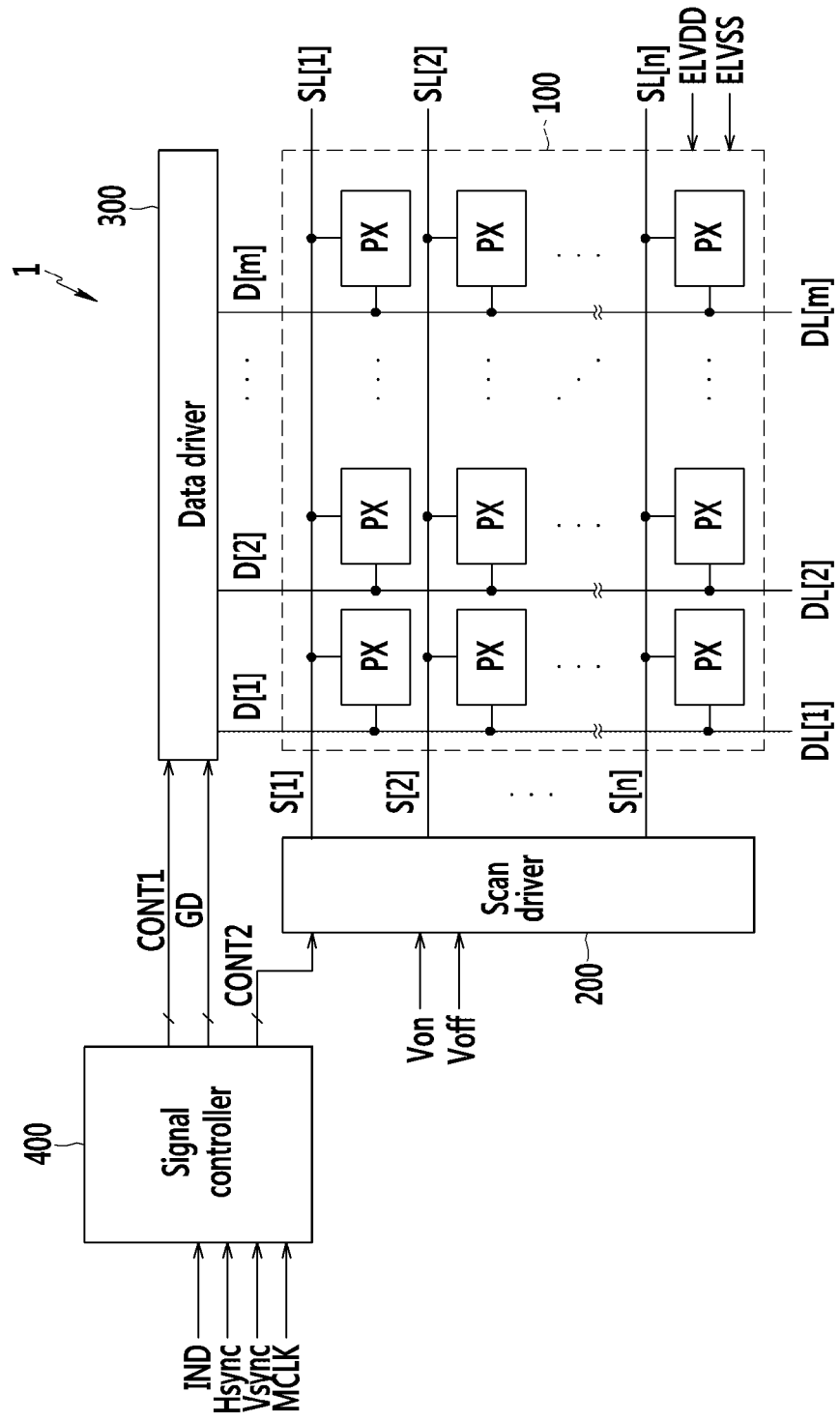
FIG. 1 shows an OLED display device according to an exemplary embodiment.

In the following detailed description, only certain exemplary embodiments have been shown and described, simply by way of illustration. As those skilled in the art would realize in view of the present disclosure, the described embodiments may be modified in various different ways, all without departing from the spirit or scope of the present teachings. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

In the following detailed description, only certain exemplary embodiments have been shown and described, simply by way of illustration.

Hereinafter, an exemplary embodiment will be described with reference to the drawings.

FIG. 1 shows in block diagram form, an organic light emitting diodes (OLED) display according to an exemplary embodiment.

Referring to FIG. 1, an OLED display 1 according to the exemplary embodiment includes a display area unit 100, a scan driver 200, a data driver 300, and a signal controller 400. The display area unit 100 is disposed in an image displaying area and it includes a plurality of pixels PX distributed as a matrix, and a plurality of scan lines SL[1] to SL[n] extending in a first direction for transmitting respective scan signals S[1] to S[n] to the matrix and a plurality of data lines DL[1] to DL[m] extending in a second direction for transmitting respective data signals D[1] to D[m] to the matrix. The scan and data lines extend within the display area of the display unit 100. In addition, a line (not shown) for applying a first driving voltage ELVDD and a line (not shown) for applying a second driving voltage LEVSS are formed in the display area unit 100.

Here, each of the plurality of pixels PX is connected to a corresponding one of the data lines DL[1] to DL[m] and to a corresponding one of the scan lines SL[1] to SL[n].

The scan driver 200 is connected to the plurality of scan lines SL[1] to SL[n], and generates a corresponding plurality of scan signals S[1] to S[n] according to a provided scan control signal CONT2. The scan driver 200 sequentially generates the plurality of scan signals S[1]-S[n] to the corresponding plurality of scan lines SL[1] to SL[n]. Here, the plurality of scan signals S[1] to S[n] include pixel activating signals that allow for transmission of data signals to the respectively corresponding pixels PX. Each of the plurality of scan signals S[1] to S[n] is formed of a combination of levels including a gate-on voltage Von that turns on a switching transistor TR1 (refer to FIG. 2) and a gate-off voltage Voff that turns off the switching transistor TR1.

Moreover, the data driver 300 is connected to the plurality of data lines DL[1] to DL[m], and generates the plurality of analog data signals D[1] to D[m] by sampling and holding a provided digital image data signal GD according to a data control signal CONT1. The data driver 300 transmits the plurality of analog data signals D[1] to D[m] to the plurality of data lines. Here, the plurality of data signals D[1] to D[m] are generated by performing an image processing process such as luminance compensation on an external image signal IND supplied to the signal controller 400.

The signal controller 400 that receives the external image signal IND also receives a corresponding synchronization signal, converts the image signal IND to the image data signal GD, and controls functions and driving of the respective elements of the display. Here, the synchronization signal includes a vertical synchronization signal Vsync, a horizontal synchronization signal Hsync, and a main clock signal MCLK. In further detail, the signal controller 400 generates the image data signal GD by dividing the image signal IND into respective frame units in accordance with the supplied vertical synchronization signal Vsync and by dividing the image signal IND in accordance with scan line units that are demarked by the supplied horizontal synchronization signal Hsync.

Figure 2:
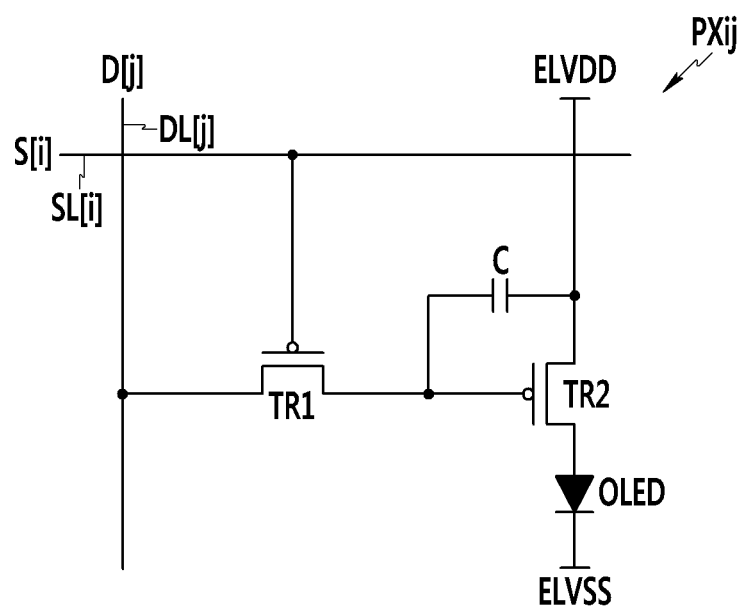
FIG. 2 is an equivalent circuit diagram of an exemplary pixel PX within the display device of FIG. 1.

FIG. 2 is an equivalent circuit diagram of an exemplary pixel PX(i,j) that may be used in the exemplary display device 1.

Referring to FIG. 2, the pixel PXij is connected to the i-th scan line SL[i] and the j-th data line DL[j]. The pixel PXij includes a switching transistor TR1, a driving transistor TR2, a capacitor C, and an organic light emitting diode OLED. The switching transistor TR1 includes a gate electrode connected to the scan line SL[i], a source electrode connected to the data line DL[j], and a drain electrode connected to a gate electrode of the driving transistor TR2 as well as to the capacitor C.

The driving transistor TR2 includes a source electrode to which the first driving voltage ELVDD is transmitted, a drain electrode connected to an anode of the organic light emitting diode OLED, and a gate electrode to which a data signal D[j] is transmitted during a turn-on period of the switching transistor TR1.

The capacitor C is connected between the gate electrode and the source electrode of the driving transistor TR2. A cathode of the organic light emitting diode OLED receives the second driving voltage EVLSS. For a pixel PXij having such a configuration, the data signal D[j] is transmitted to the gate electrode of the driving transistor TR2 when the switching transistor TR1 is turned on by a scan signal S[i] when the latter presents a gate-on voltage level ($V_{Gon}$). A voltage difference between the gate electrode and the source electrode of the driving transistor TR2 is maintained by the capacitor C, and driving current flows to the driving transistor TR2. According to the driving current, the organic light emitting diode OLED emits a corresponding amplitude of colored or white light.

Meanwhile, in such an embodiment the pixel PX of FIG. 2 is an exemplary pixel of the display, and pixels having different structures may be used instead.

Figure 3:
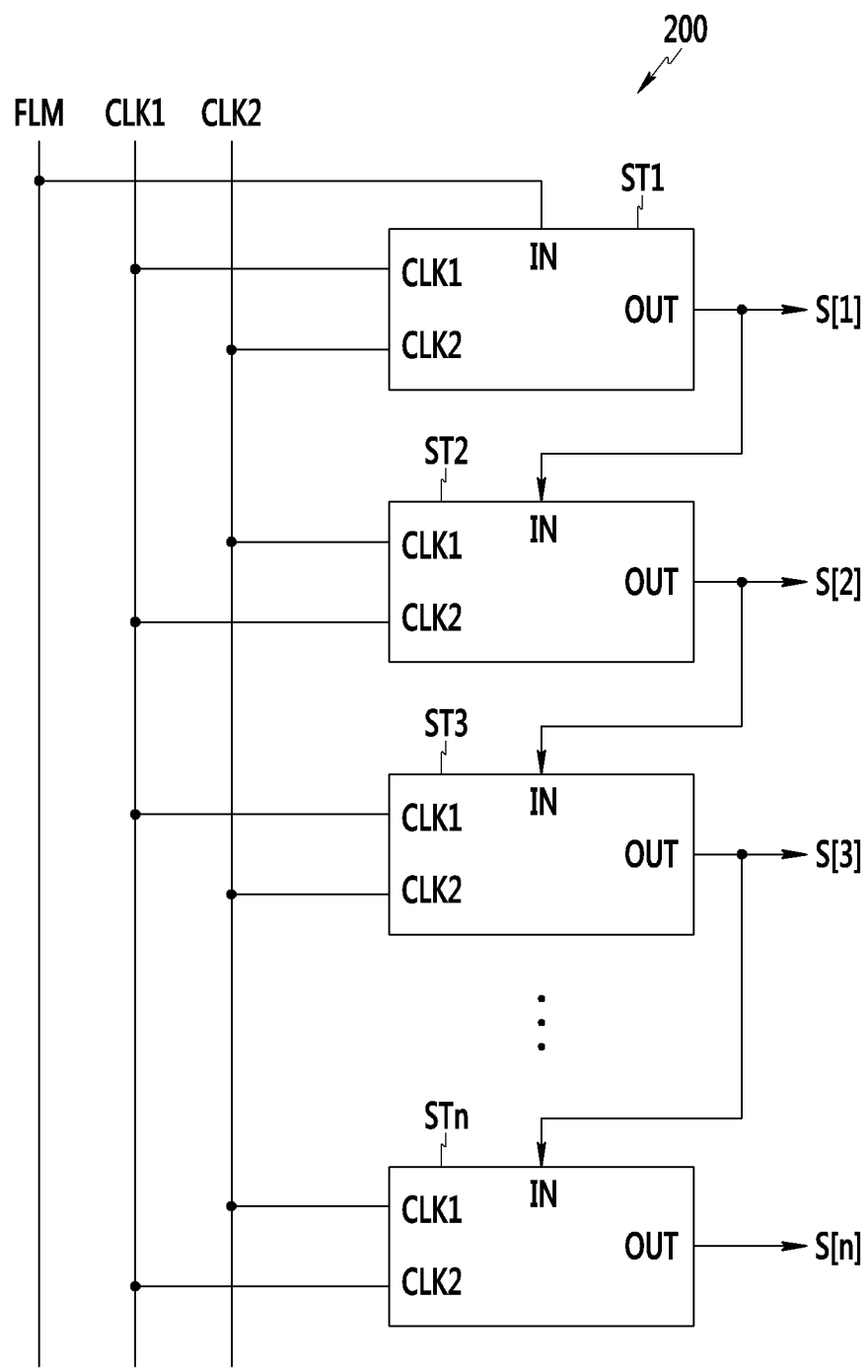
FIG. 3 is a detailed block diagram of a scan driver 200 of FIG. 1.

FIG. 3 is a detailed block diagram of the scan driver 200 of FIG. 1.

Referring to FIG. 3, the scan driver 200 according to the exemplary embodiment includes a plurality of scan driving blocks ST1 to STn sequentially connected one to the next. Each of the plurality of scan driving blocks ST1 to STn receives an input signal, and generates a respective one of the plurality of scan signals S[1] to S[n] and respectively applies them to the corresponding plurality of scan lines SL[1] to SL[n].

Each of the plurality of scan driving blocks ST1 to STn includes an input terminal for receiving a first clock signal CLK1, an input terminal for a second clock signal CLK2, an input terminal IN to which a frame start signal FLM or an output signal of a sequentially preceding scan driving block is input, and an output terminal OUT from which the corresponding scan signal of the scan signals S[1] to S[n] is output.

Among the plurality of scan driving blocks ST1 to STn, a first scan driving block ST1 in the chain receives the frame start signal FLM and generates a first scan signal S[1], and transmits the first scan signal S[1] to the first scan line SL[1] and also to the second scan driving block ST2. The second scan driving block ST2 receives the first scan signal S[1] and generates a second scan signal S[2], and transmits the second scan signal S[2] to a second scan line SL[2] and also to a third scan driving block ST3. As described, the scan signals are sequentially generated from the plurality of scan driving blocks ST1 to STn and then transmitted to the plurality of scan lines SL[1] to SL[n].

Figure 4:
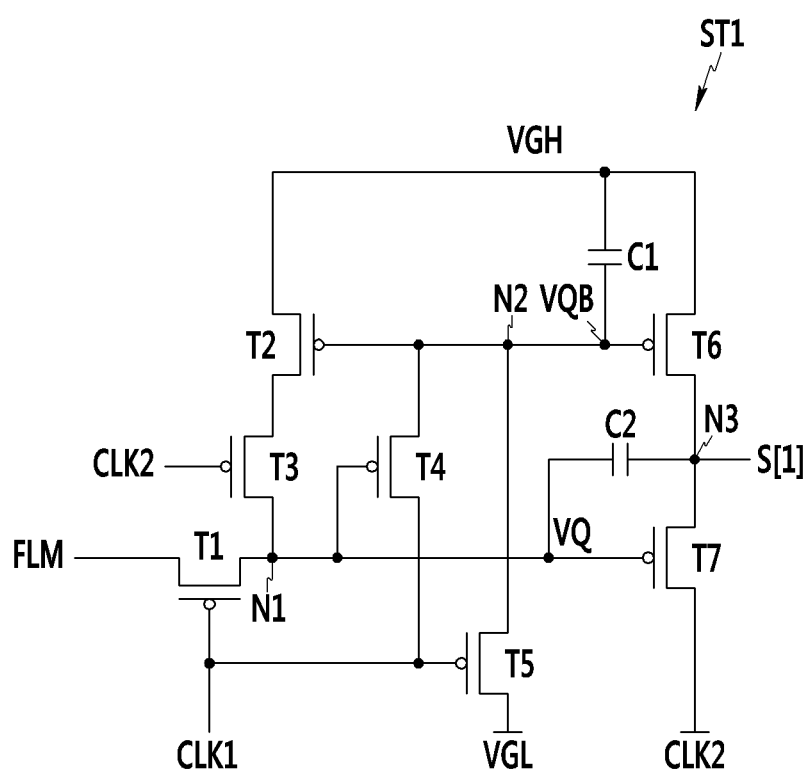
FIG. 4 is a circuit diagram of an exemplary embodiment of a scan driving block ST1 of FIG. 3.

FIG. 4 is a circuit diagram of an exemplary embodiment of the scan driving block ST1 of FIG. 3.

Referring to FIG. 4, the scan driving block ST1 includes first to seventh transistors T1 to T7 and first and second capacitors C1 and C2. FIG. 4 is a circuit diagram of the scan driving block ST1 among the plurality of scan driving blocks ST to STn, and unlike the scan driving block ST1, other scan driving blocks ST2 to STn of the chain receive scan signals S[1] to S[n−1] from adjacent scan driving blocks instead of receiving the frame start signal FLM.

The first transistor T1 includes a gate electrode to which the first clock signal CLK1 is transmitted, a first I/O electrode to which the frame start signal FLM is transmitted, and a second I/O electrode connected to a first node N1 of the illustrated circuit. (The said I/O electrodes are alternatively known as source and drain electrodes. In the illustrated example, all the transistors are PMOS devices and therefore the corresponding gate terminal is driven low (L) when it is desired to place the transistor in a conductive state. Conversely, the corresponding gate terminal is driven high (H) when it is desired to place the transistor in a nonconductive state.)

The second transistor T2 includes a respective source electrode to which a relatively high (H), first power source voltage VGH is transmitted and a gate electrode connected to a circuit node referred to herein as the second node N2.

The third transistor T3 includes a respective gate electrode to which the second clock signal CLK2 is transmitted, a first I/O electrode connected to the drain electrode of the second transistor T2, and a second I/O electrode connected to the first node N1. The fourth transistor T4 includes a respective gate electrode connected to the first node N1, a first I/O electrode connected to the second node N2, and a second I/O electrode connected to the gate electrode of the first transistor T1.

The fifth transistor T5 includes a respective gate electrode to which the first clock signal CLK1 is transmitted, a source electrode connected to the second node N2, and a drain electrode to which a relatively low (L), second power source voltage VGL is transmitted. The sixth transistor T6 includes a source electrode to which the first power source voltage VGH is transmitted, a respective gate electrode connected to the second node N2, and a drain electrode connected to a third node N3.

The seventh transistor T7 includes a respective gate electrode connected to the first node N1, a first I/O electrode connected to the third node N3, and a second I/O electrode to which the second clock signal CLK2 is transmitted. The first capacitor C1 includes a first terminal to which the first power source voltage VGH is transmitted and a second terminal connected to the second node N2. The second capacitor C2 includes a first terminal connected to the gate electrode of T7 and a second terminal connected to the third node N3. Here, the first power source voltage VGH is a high-level voltage (H) and the second power source voltage VGL is a low-level voltage (L). The first scan signal S[1] is output through the third node N3.

As mentioned, the first to seventh transistors T1 to T7 are p-channel field effect transistors (PMOS devices). The first to seventh transistors T1 to T7 are turned on by the low-level voltage (L) being applied to their respective gates and turned off by the high-level voltage (H) being applied. In alternate embodiments, at least one of the first to seventh transistors T1 to T7 may be an n-channel field effect transistor (an NMOS device). In addition, at least one of the first I/O electrode and the second I/O electrode may be referred to as a source electrode.

Figure 5:
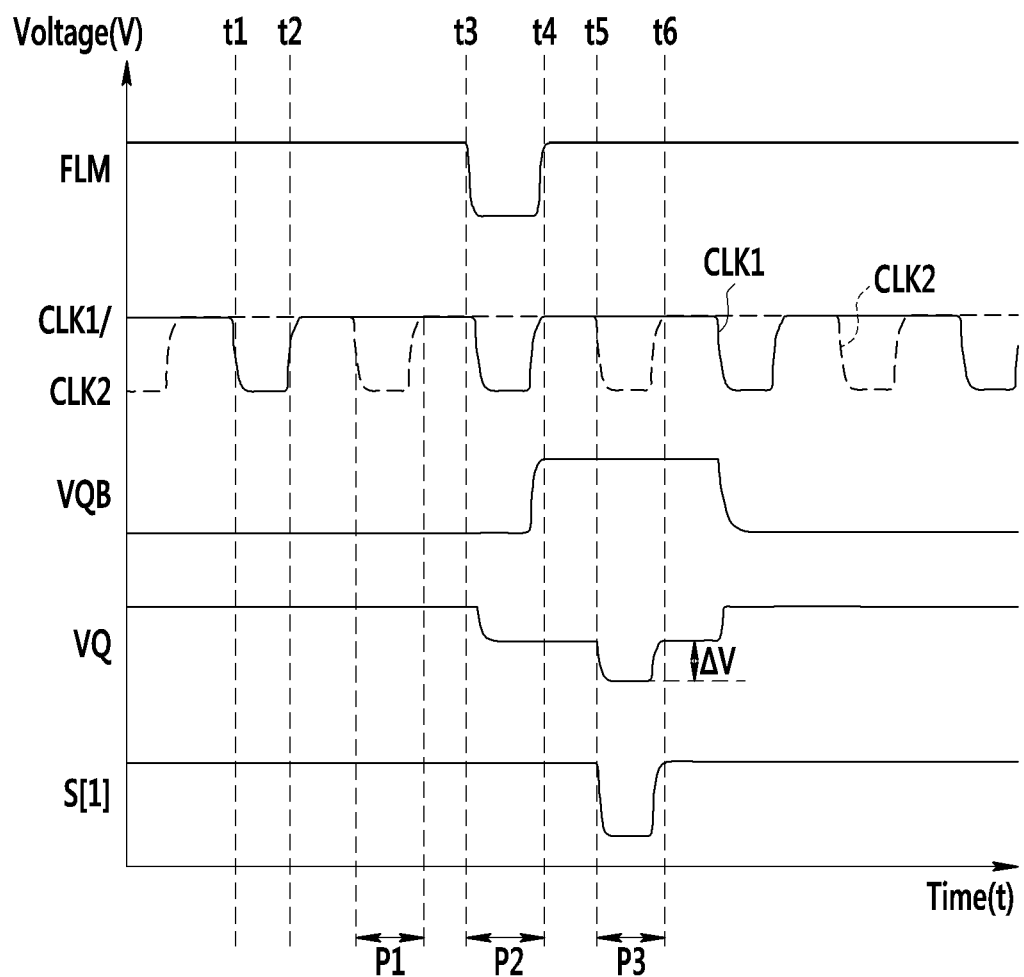
FIG. 5 is a timing diagram provided for description of operation of the scan driving block ST1 of FIG. 4.

FIG. 5 is a timing diagram provided for description of operation of the scan driving block ST1 of FIG. 4.

Referring to FIG. 5, at a first time point denoted as t1, the frame start signal FLM is transmitted as a continued high-level voltage (H) and the first clock signal CLK1 is then transitioning from the H level to the low-level voltage (L). In this instant (t1), the second clock signal CLK2 is at and still maintaining a high-level voltage (H). (The second clock signal CLK2 is plotted as a dashed curve.) In the following description, the case in which the high-level of the frame start signal FLM and the first and second clock signals CLK1 and CLK2 is equivalent to a level of the first power source voltage VGH and the case of the low level is equivalent to a level of the second power source voltage VGL will be exemplarily described. As a result of FLM being high (H) and CLK1 transitioning to low (L) the first transistor T1 is being turned on at time points t1. Therefore a voltage VQ of the first node N1 is driven by T1 to the high (H) level of the first power source voltage VGH. Thus, the seventh transistor T7 (a PMOS device) is then kept in a turned-off state.

At the same time (t1), the fifth transistor T5 is turned on by virtue of CLK1 going low (L) and a voltage VQB of the second node N2 is pulled down to the low (L) level of the second power source voltage VGL. As a result, the sixth transistor T6 is then turned on and the first scan signal S[1] is output as the high (H) level of the first power source voltage VGH. Next, at time point t2, when the first clock signal CLK1 is transitioning to a high-level voltage (H), the first and fifth transistors T1 and T5 are turned off, thus respectively discontinuing their respective transmitting of FLM and VGL respectively to the first and second nodes, N1 and N2.

At a following time point t3, the frame start signal FLM is transitioning to a low-level voltage (L) and the first clock signal CLK1 is transitioning to a low-level voltage (L). In this case, which happens to be the start of second time period P2, the second clock signal CLK2 has transitioned low (L) and then back high (H) again, wherefore it is maintaining the high-level (H) at third time point t3.

Therefore, the first and fifth transistors T1 and T5 are again turned on and thus the voltage VQ of the first node N1 and the voltage VQB of the second node N2 are driven low to the level of the second power source voltage VGL. Accordingly, the seventh transistor T7 is turned on at the same time that high (H) level of CLK2 is applied to its lower I/O electrode. Next, at a following fourth time point t4, the first clock signal CLK1 is transitioning to a high-level voltage (H). Then, the voltage VQB of the second node N2 becomes a level of the first power source voltage VGH and the sixth transistor T6 is turned off. In this case, the first scan signal S[1] maintains a high (H) level of the first power source voltage VGH.

Then, in a following fifth time point t5, when the second clock signal CLK2 is transitioning to a low-level (L) voltage, the third transistor T3 is turned on. And, the first scan signal S[1] is output as transitioning to the low-level (L) voltage level of the second power source voltage VGL.

Then, in a following sixth time point t6, when the second clock signal CLK2 is transitioning to the high-level voltage (H), the first scan signal S[1] is output transitioning high (H) to the level of the first power source voltage VGH.

The frame start signal FLM, the voltages VQ and VBQ of the first and second nodes N1 and N2, and the voltage level of the first scan signal S[1] can be shown as in Table 1. Table 1 shows a simulation result in a case that the first power source voltage VGH is 5.2 V, the second power source voltage VGL is −7.0 V, and a threshold voltage Vth of each of the first to seventh transistors T1 to T7 is −2.0 V. The respective first, second and third time periods, P1, P2 and P3 are disposed as shown in FIG. 5, with P1 being interposed between t2 and t3, with P2 being bounded by t3 and t4 and with P3 being bounded by t5 and t6.

TABLE 1

|  | P1 | P2 | P3 |
|---|---|---|---|
| FLM | 5.2 | −7.0 | 5.2 |
| VQ | 5.2 | −5.0 | −17.2 |
| VQB | −5.0 | −5.0 | 5.2 |
| S[1] | 5.2 | 5.2 | −7.0 |

As shown in Table 1, during the third period P3, the voltage VQ of the first node N1 is boosted downward by the second capacitor C2 and is thus further decreased as much as ΔV(=VGH−VGL). That is, the voltage VQ of the first node N1 becomes a level of (VGL−Vth)−ΔV, 2VGL−Vth−VGH.

In addition, Table 2 shows a drain-source voltage Vds and a gate-source voltage Vgs of the first transistor T1 for each period P1 to P3.

TABLE 2

|  |  | P1 | P2 | P3 |
|---|---|---|---|---|
| T1 | Vds | 0 | 0 | 22.4 |
|  | Vgs | 0 | −2 | 0 |

As shown in Table 2, in the period P3, a drain-source voltage Vds of the first transistor T1 is 22.4 V. That is, since the voltage VQ of the first node N1 becomes lower than the second power source voltage VGL, a driving bias voltage of the first transistor T1 becomes greater than a difference between the first power source voltage VGH and the second power source voltage VGL.

In this case, stress is applied to the first transistor T1 and thus an element characteristic may be changed, and a leakage current path may be generated from the first node N1 to FLM, thereby deteriorating efficiency of the driving circuit. (The applied stress can breakdown the insulative properties of the very thin gate insulation layer of T1 where, during time period P3, the positive gate voltage is substantially the same as the FLM voltage and the VQ voltage is very negative (e.g., −17.2V) due to a boost provided by capacitor C2.)

Figure 6:
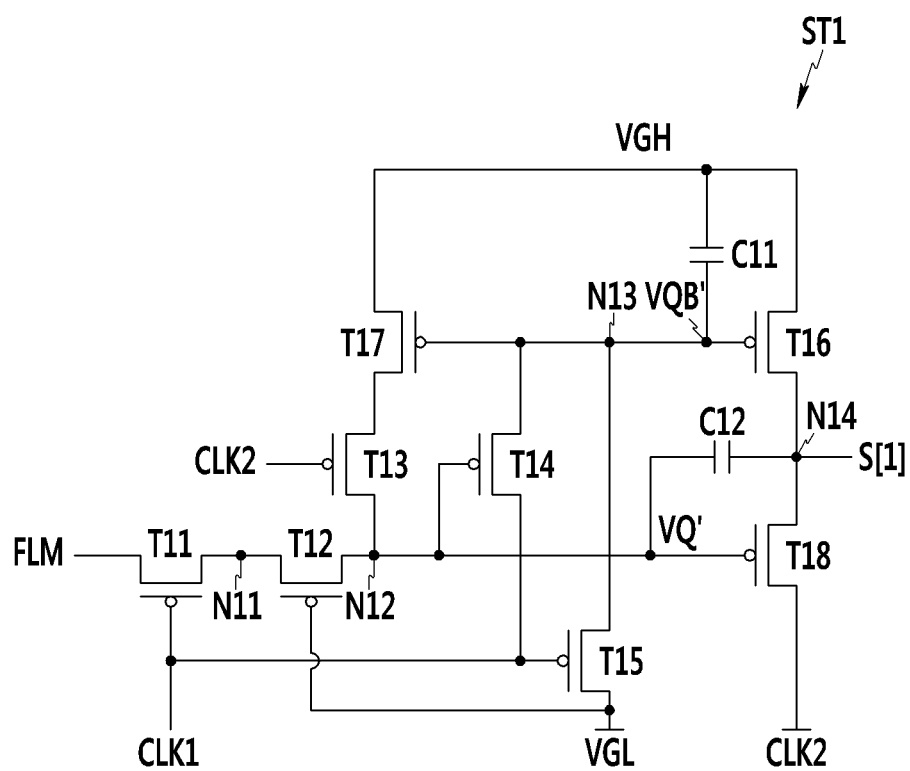
FIG. 6 is a circuit diagram of another exemplary embodiment of a scan driving block ST1 usable in FIG. 3.

FIG. 6 is a circuit diagram of another exemplary embodiment of the scan driving block ST1 of FIG. 3.

Referring to FIG. 6, a scan driving block ST1 according to the present exemplary embodiment includes first to eighth transistors T11 to T18 and first and second capacitors C11 and C12. Of significance, transistor T12 is interposed between transistor T11 and the N12 node. FIG. 6 is a circuit diagram of the scan driving block ST1 among a plurality of scan driving blocks ST1 to STn, and the scan driving block ST1 is the same as other scan driving blocks ST2 to STn excluding that the other scan driving blocks ST2 to STn receive scan signals S[1] to S[n−1] output from adjacent scan driving blocks instead of receiving a frame start signal FLM.

The first transistor T11 includes a gate electrode to which a first clock signal CLK1 is transmitted, a first I/O electrode to which the frame start signal FLM is transmitted, and a second I/O electrode connected to a first node N11. The first transistor T11 is turned on by the first clock signal CLK1 and transmits the frame start signal FLM to the first node N11.

The second transistor T12 includes a gate electrode to which a second power source voltage VGL is transmitted, a first I/O electrode connected to the first node N1, and a second I/O electrode connected to a second node N12. The second transistor T12 maintains a turn-on state, and limits a level of a drain-source voltage Vds developed across the first transistor T11 by creating a voltage divider network whose voltage division function depends on the on-resistance value ($R_{DS12}$) of the second transistor T12.

The third transistor T13 includes a gate electrode to which the second clock signal CLK2 is transmitted, a first I/O electrode connected to a drain electrode of the fourth transistor T14, and a second I/O electrode connected to the second node N12. The fourth transistor T14 includes a gate electrode connected to the second node N12, a first I/O electrode connected to a third node N13, and a second I/O electrode connected to the gate electrode of the first transistor T11.

The fifth transistor T15 includes a gate electrode to which the first clock signal CLK1 is transmitted, a source electrode connected to the third node N13, and a drain electrode to which the second power source voltage VGL is transmitted. The sixth transistor T16 includes a source electrode to which the first power source voltage VGH is transmitted, a gate electrode connected to the third node N13, and a drain electrode connected to a fourth node N14.

The seventh transistor T17 includes a gate electrode connected to the third node N13 and a source electrode to which the first power source voltage VGH is transmitted. The eighth transistor T18 includes a gate electrode connected to the second node N12, a first I/O electrode connected to the fourth node N14, and a second I/O electrode to which the second clock signal CLK2 is transmitted.

The first capacitor C11 includes a first terminal to which the first power source voltage VGH is transmitted and a second terminal connected to the third node N13. The second capacitor C12 includes a first terminal connected to the gate electrode of the eighth transistor T18 and a second terminal connected to the fourth node N14. Here, the first power source voltage VGH is a high-level voltage (H) and the second power source voltage VGL is a low-level voltage (L). The first scan signal S[1] is output through the fourth node N14.

The first to eighth transistors T11 to T18 are p-channel field effect transistors. The first to eighth transistors T11 to T18 are turned on by a low-level voltage and turned off by a high-level voltage. In an alternate embodiment, at least one of the first to eighth transistors T11 to T18 may instead be an n-channel field effect transistor.

Figure 7:
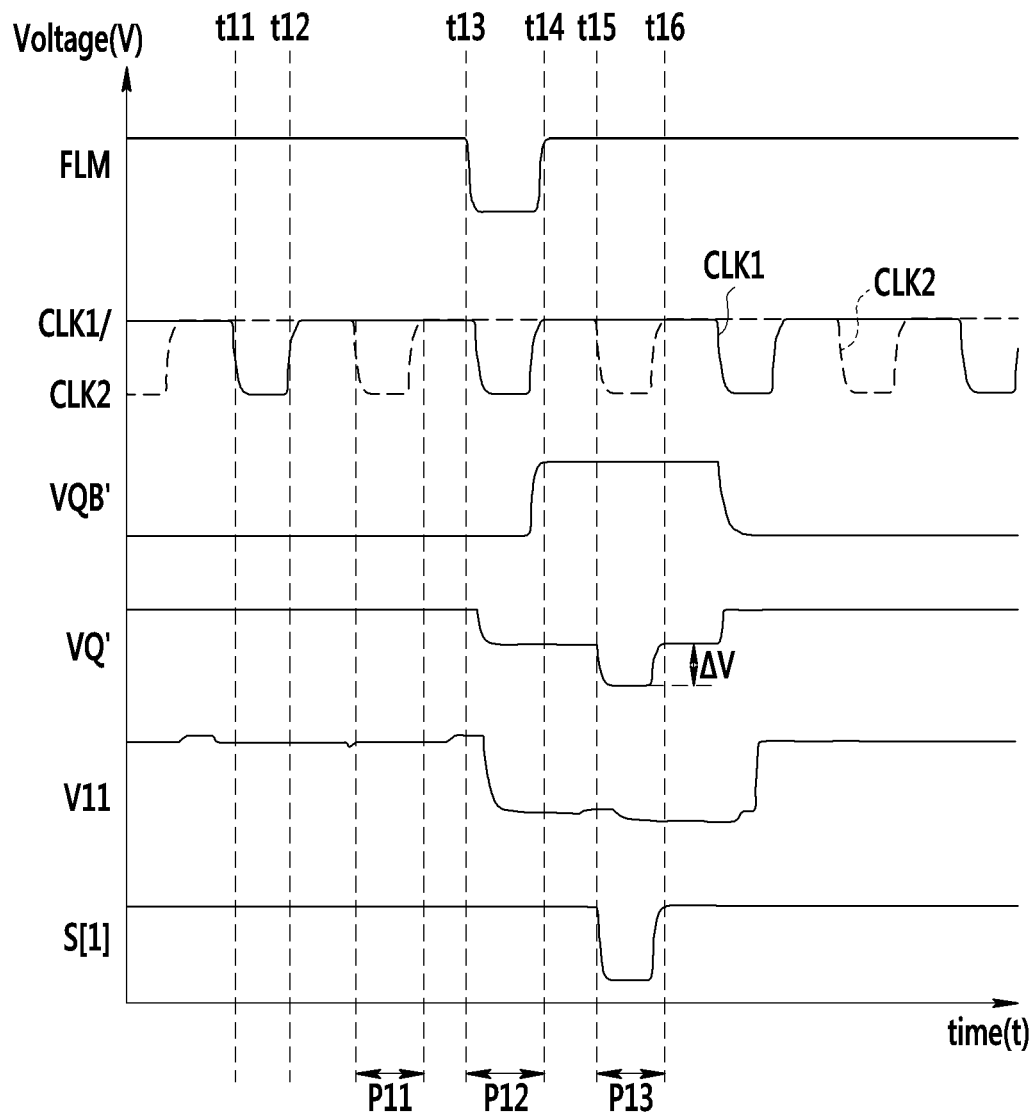
FIG. 7 is a timing diagram provided for description of operation of the scan driving block ST of FIG. 6.

FIG. 7 is a timing diagram provided for description of operation of the scan driving block ST1 of FIG. 6.

Referring to FIG. 7, at a first time point t1, the frame start signal FLM is transmitted as a high-level voltage and the first clock signal CLK1 is transitioning to a low-level voltage. In this case, the second clock signal CLK2 maintains a high-level voltage. Then, the first transistor T11 is turned on. In this case, the second transistor T12 is in a turn-on state, and therefore a voltage VQ' of the second node N12 becomes a level of the first power source voltage VGH. Accordingly, the eighth transistor T18 maintains a turn-off state.

At the same time, the fifth transistor T15 is turned on and a voltage VQB' of the third node N13 becomes a level of the second power source voltage VGL. Then, the sixth transistor T16 is turned on and the first scan signal S[1] is output with the level of the first power source voltage VGH. Then, when the first clock signal CLK1 is transitioning to a high-level voltage at a time t12, the first and fifth transistors T11 and T15 are turned off.

In this state, the frame start signal FLM is transitioning to a low-level voltage and the first clock signal CLK1 is transitioning to the low-level voltage at a time t13. In this case, the second clock signal CLK2 maintains a high-level.

Then, the first and fifth transistors T11 and T15 are turned on and thus the voltage VQ' of the second node N12 and the voltage VQB' of the third node N13 become the level of the second power source voltage VGL. Accordingly, the eighth transistor T18 is turned on.

At a time point t14, the first clock signal CLK1 is transitioning to a high-level voltage. Then, the voltage VQB' of the third node N13 becomes the level of the first power source voltage VGH and the sixth transistor T16 is turned off. In this case, the first scan signal S[1] is maintained with the level of the first power source voltage VGH.

When the second clock signal CLK2 is transitioning to a low-level voltage at a time t15, the third transistor T13 is turned on. In addition, the first scan signal S[1] is output with the level of the second power source voltage VGL. In this case, the voltage VQ' of the second node N12 is boosted by the second capacitor C12 and thus becomes further decreased as much as ΔV.

In this state, when the second clock signal CLK2 is transitioning to a high-level at a time point t16, the first scan signal S[1] is output with the level of the first power source voltage VGH.

Respective voltage levels of the frame start signal FLM, the voltages V11, VQ', and VQB' of the first to third nodes N1 to N13 respectively, and the first scan signal S[1] of each of the periods P11 to P13 according to the above-stated operation can be shown as in Table 3.

TABLE 3

|      | P11  | P12  | P13   |
|------|------|------|-------|
| FLM  | 5.2  | −7.0 | 5.2   |
| V11  | 5.2  | −5.0 | −5.0  |
| VQ'  | 5.2  | −5.0 | −17.2 |
| VQB' | −5.0 | −5.0 | 5.2   |
| S[1] | 5.2  | 5.2  | −7.0  |

In this case, a drain-source voltage Vds and a gate-source voltage Vgs of each of the first and second transistors T11 and T23 of each of the periods P11 to P13 are as shown in Table 4.

TABLE 4

|     |     | P11   | P12  | P13   |
|-----|-----|-------|------|-------|
| T11 | Vds | 0     | 2.0  | 10.2  |
|     | Vgs | 0     | 2.0  | −10.2 |
| T12 | Vds | 0     | 0    | 12.2  |
|     | Vgs | −12.2 | −2.0 | −2.0  |

That is, the voltage different between the VQ' level of the second node N12 and the level of the FLM signal is divided across a voltage divider defined by the first transistor T11 and the second transistor T12. In other words, the break down stress applied to the first transistor T11 is a function of the on-resistance value ($R_{DS12}$) of the second transistor T12 where the latter dissipates part of the large voltage difference (e.g., 22.4V) that develops between the FLM input terminal and node N12 in time period P13. Accordingly, although the voltage VQ' of the second node N12 becomes lower than the second power source voltage VGL, the drain-source voltage Vds developed across the first transistor T11 is not as large as it would have been if the second transistor T12 was not present. Thus, a bias voltage of the first transistor T11 becomes a voltage level of VGH−(VGL−Vth) so that leakage current through T11 can be prevented or reduced and operation can be stably performed.

While this disclosure of invention has been provided in connection with what is presently considered to be a practical exemplary embodiment, it is to be understood that the disclosure is not limited to the disclosed embodiments, but, on the contrary, is intended to cover various modifications and equivalent arrangements included within the spirit and scope of the present teachings.

What is claimed is:

1. A scan lines driver comprising a plurality of successive scan driving blocks, each including a respective first input terminal to which one of a frame start signal or an output signal from a previous scan driving block of the succession of scan driving blocks is input by way of a corresponding first control connection, respective second and third input terminals to which first and second clock signals are applied by way of corresponding second and third control connections, and a respective output terminal from which a corresponding scan signal is output, wherein each of the plurality of scan driving blocks respectively comprises:

a first transistor interposed between the respective first input terminal of its respective scan driving block and a first node of its respective scan driving block and configured so as to selectively transmit there through or block the corresponding frame start signal or the output signal of the previous scan driving block in accordance with the clock signal delivered to the second input terminal of its respective scan driving block;

a second transistor coupled to the respective third input terminal and output terminal of its respective scan driving block and configured so as to selectively coupled the third input terminal with the output terminal in accordance with a voltage level present on the first node of its respective scan driving block; and a third transistor interposed between the respective first input terminal of its respective scan driving block and the first node so as to be in series with the first transistor and to thereby dissipate a portion of a voltage developed between the first node and the first input terminal of its respective scan driving block.

2. The scan lines driver of claim 1, wherein the third transistor is connected between the first transistor and the first node and is coupled so as to maintain a turned-on state having a corresponding drain-to-source resistance.

3. The scan lines driver of claim 1, wherein each of the plurality of scan driving blocks further respectively comprises:

a fourth transistor including a gate electrode to which the clock signal of the second input terminal is transmitted, a first I/O electrode connected to a second node of its respective scan driving block, and a second I/O electrode to which a first power source voltage is transmitted;

a fifth transistor including a gate electrode connected to the first node, a first I/O electrode connected to the second node, and a second I/O electrode connected to the gate electrode of the fourth transistor;

a sixth transistor including a gate electrode connected to the second node, a first I/O electrode to which a second power source voltage is transmitted, and a second I/O electrode connected to the output terminal;

a seventh transistor including a gate electrode connected to the second node and a first I/O electrode to which the second power source voltage is transmitted; and an eighth transistor including a gate electrode to which the second clock signal is transmitted, a first I/O electrode connected to a second electrode of the seventh transistor, and a second I/O electrode connected to the first node.

4. The scan lines driver of claim 3, wherein the first to eighth transistors are PMOS transistors.

5. The scan lines driver of claim 3, wherein each of the plurality of scan driving blocks further respectively comprises:

a first capacitor including a first terminal to which the second power source voltage is transmitted and a second terminal connected to the second node; and a second capacitor including a first terminal connected to the first node and a second terminal connected to the output terminal.

6. The scan lines driver of claim 1, wherein the first clock signal and the second clock signal have opposite phases and are overlapped at times to have a same level.

7. The scan driver of claim 6, wherein, in each of the plurality of scan driving blocks, the second transistor is turned on by being synchronized by the clock signal of the second input terminal, and a voltage level of the clock signal of the third input terminal is output to the output terminal as the scan signal for a period during which the frame start signal or the output signal of the first input terminal is transitioning to a low-level voltage from a high-level.

8. An organic light emitting diodes (OLED) display comprising:

a display area unit having distributed there across, a plurality of data lines, a plurality of scan lines, and a plurality of pixels each respective connected to a corresponding one of the data lines and a corresponding one of the scan lines;

a scan lines driver including a plurality of successive scan driving blocks, each including a respective first input terminal to which one of a frame start signal or an output signal from a previous scan driving block of the succession of scan driving blocks is input by way of a corresponding first control connection, respective second and third input terminals to which first and second clock signals are applied by way of corresponding second and third control connections, and a respective output terminal from which a corresponding scan signal is output, wherein each of the plurality of scan driving blocks respectively comprises:

a first transistor interposed between the respective first input terminal of its respective scan driving block and a first node of its respective scan driving block and configured so as to selectively transmit therethrough or block the corresponding frame start signal or the output signal of the previous scan driving block in accordance with the clock signal delivered to the second input terminal of its respective scan driving block;

a second transistor coupled to the respective third input terminal and output terminal of its respective scan driving block and configured so as to selectively coupled the third input terminal with the output terminal in accordance with a voltage level present on the first node of its respective scan driving block; and a third transistor interposed between the respective first input terminal of its respective scan driving block and the first node so as to be in series with the first transistor and to thereby dissipate a portion of a voltage developed between the first node and the first input terminal of its respective scan driving block.

9. The OLED display of claim 8, wherein the third transistor is connected between the first transistor and the first node and maintains a turn-on state.

10. The OLED display of claim 8, wherein each of the plurality of scan driving blocks further comprises:

a fourth transistor including a gate electrode to which the first clock signal is transmitted, a first electrode connected to a second node, and a second electrode to which a first power source voltage is transmitted;

a fifth transistor including a gate electrode connected to the first node, a first electrode connected to the second node, and a second electrode connected to the gate electrode of the fourth transistor;

a sixth transistor including a gate electrode connected to the second node, a first electrode to which a second power source voltage is transmitted, and a second electrode connected to the output terminal;

a seventh transistor including a gate electrode connected to the second node and a first electrode to which the second power source voltage is transmitted; and an eighth transistor including a gate electrode to which the second clock signal is transmitted, a first electrode connected to a second electrode of the seventh transistor, and a second electrode connected to the first node.

11. The OLED display of claim 10, wherein the first to eighth transistors are PMOS transistors.

12. The OLED display of claim 10, wherein each of the plurality of scan driving blocks further comprises:

a first capacitor including a first terminal to which the second power source voltage is transmitted and a second terminal connected to the second node; and a second capacitor including a first terminal connected to the first node and a second terminal connected to the output terminal.

13. The OLED display of claim 8, wherein the first clock signal and the second clock signal have opposite phases and are overlapped within a constant period of time.

14. The OLED display of claim 13, wherein, in each of the plurality of scan driving blocks,
the second transistor is turned on by being synchronized by the first clock signal, and a voltage level of the second clock signal is output as the scan signal for a period during which the frame start signal or the output signal of the previous terminal is transitioning to a low-level voltage from a high-level.

* * * * *